US007696836B2

(12) United States Patent
Nguyen et al.

(10) Patent No.: US 7,696,836 B2
(45) Date of Patent: Apr. 13, 2010

(54) ETHERNET COUPLING

(75) Inventors: Thomas Nguyen, Fremont, CA (US); Jerry Martinson, San Jose, CA (US)

(73) Assignee: Aruba Networks, Inc., Sunnyvale, CA (US)

( * ) Notice: Subject to any disclaimer, the term of this patent is extended or adjusted under 35 U.S.C. 154(b) by 190 days.

(21) Appl. No.: 11/929,679

(22) Filed: Oct. 30, 2007

(65) Prior Publication Data

US 2009/0108964 A1 Apr. 30, 2009

(51) Int. Cl.
*H01P 5/00* (2006.01)
*H03H 7/00* (2006.01)

(52) U.S. Cl. .................................... 333/24 R; 333/177

(58) Field of Classification Search .................. 333/12, 333/22 R, 24 R, 32, 177, 181
See application file for complete search history.

(56) References Cited

U.S. PATENT DOCUMENTS 5,077,543 A * 12/1991 Carlile ...................... 333/177
5,659,273 A * 8/1997 Harpham ................. 333/22 R
5,971,813 A 10/1999 Kunz et al.
6,049,258 A * 4/2000 Fawal et al. ................ 333/177
6,492,880 B1 * 12/2002 Chiappe et al. .......... 333/22 R
7,123,117 B2 * 10/2006 Chen et al. ................. 333/177
7,348,862 B1 * 3/2008 Norte ......................... 333/12
2009/0085726 A1 * 4/2009 Radtke ................. 340/310.17

* cited by examiner

*Primary Examiner*—Dean O Takaoka
(74) *Attorney, Agent, or Firm*—Blakely, Sokoloff, Taylor & Zafman LLP

(57) ABSTRACT

Improved coupler for Ethernet over twisted pair. An improved coupler has a first common mode choke for connecting an Ethernet PHY to the primary winding of a transformer. The secondary winding of the transformer connects through a second common mode choke for connection to a twisted pair line. In one embodiment, the first common mode choke, transformer, and second common mode choke are placed in the same package. In a second environment, a plurality of choke-transformer-choke units are placed in the same package. In a third embodiment, the plurality of choke-transformer-choke units may be integrated into a connector. Pairs of the second common mode chokes may share cores.

18 Claims, 2 Drawing Sheets

ETHERNET COUPLING

BACKGROUND OF THE INVENTION

The present invention relates to magnetic coupling used in Ethernet over twisted pair networks.

An important step in the evolution of Ethernet local area networking was the transition from shielded coaxial cable as the transmission medium to unshielded twisted pair cable. Ethernet over twisted pair cable in the form of Cat5, Cat6, and variant cables is ubiquitous; such cables comprise four twisted pairs in a common jacket. Speeds have also evolved, from 10 Mbit/sec to 100 Mbit/sec (10/100 Ethernet) to 1 Gbit/sec (Gigabit Ethernet or GigE), with higher speeds being developed.

But with higher speeds comes an increased concern with radiated interference. In the United States, computing devices used in residential areas must meet stringent Federal Communications Commission (FCC) class B limits (Title 47 Part 15 Subclass B, Class B) for conducted and radiated emissions. The European Economic Community (EEC) has similar requirements under the IEC standard CISPR 22 (EN 55022). FCC limits cover conducted emissions from 0.45 MHz to 30 MHz, and radiated emissions from 30 MHz to at least 1 GHz.

Manufacturers of digital devices, particularly those putting high speed Ethernet connected devices into residential settings face an interesting problem in making such devices comply with International standards on emissions.

BRIEF DESCRIPTION OF THE DRAWINGS

The invention may be best understood by referring to the following description and accompanying drawings that are used to illustrate embodiments of the invention in which.

DETAILED DESCRIPTION

Embodiments of the invention relate to couplers for use in Ethernet over twisted pair. In an embodiment of the invention, an Ethernet PHY connects to the primary of a transformer through a first common mode choke. The secondary of the transformer connects to a twisted pair in an Ethernet cable through a second common mode choke. One or more choke-transformer-choke units may be packaged together, and may be packaged in an Ethernet connector such as an RJ-45 style connector.

Ethernet over twisted pair cabling is ubiquitous and is covered by many standards, among them the IEEE 802.3 family. In its simplest form, the physical interface portion of an Ethernet transceiver integrated circuit (PHY), a transmitter or a receiver, connects to one winding of an isolation transformer. The other winding of the isolation transformer connects to a pair of twisted conductors. At the other end of this twisted pair, the circuit topology repeats, with the twisted pair connecting to one winding of a transformer, and the other winding of the transformer connecting to the PHY at the other end. In simple wired Ethernet such as 10BASE-T or 100BASE-TX, one twisted pair is used for communicating in each direction, using two of the four twisted pairs in a cable. The characteristics of twisted pair cables and their connectors are standardized for example as Cat 5, Cat 5e, and Cat 6 wired to TIA-568A or 568B standards.

Figure 1:
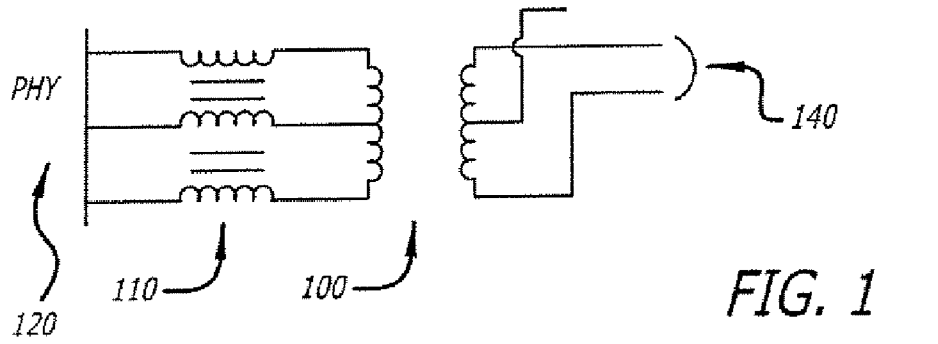
FIG. 1 (Prior Art)
FIG. 1 shows a block diagram of a first coupler.

In slow speed (such as 10 MBit) Ethernet, the primary emissions concern is with low frequency signals. The topology of FIG. 1 was developed to deal with such low-frequency issues. Transformer 100, typically wound with a 1:1 ratio and center-tapped on both primary and secondary, provides electrical isolation. Common mode choke 110 connects PHY 120 to the primary winding of transformer 100. The secondary winding of transformer 100 connects to line 140, preferably through a standardized connector. In this and other diagrams, terminations such as the "Bob Smith" termination and its variants are not shown, but are well known to the art. It is usually understood that common mode choke 110 operates most on low frequency noise. In one embodiment, choke 110 is trifilar wound on a torodial core; E cores may also be used.

Figure 2:
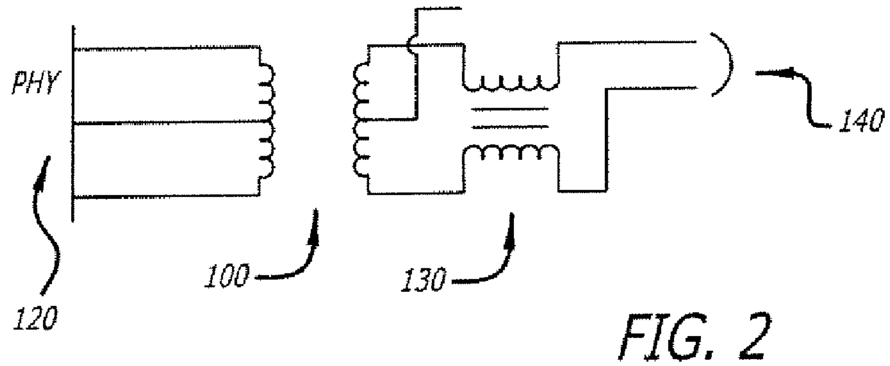
FIG. 2 (Prior Art)
FIG. 2 shows a block diagram of second coupler.

With the evolution of 100BASE-TX and 100 Mbit Ethernet, as well as with faster processor speeds in general, high frequencies become more of an issue. In FIG. 2, common mode choke 130 is understood to deal with these high frequency components.

With the move to Gigabit Ethernet, emissions issues are intensified at both low and high frequencies.

Figure 3:
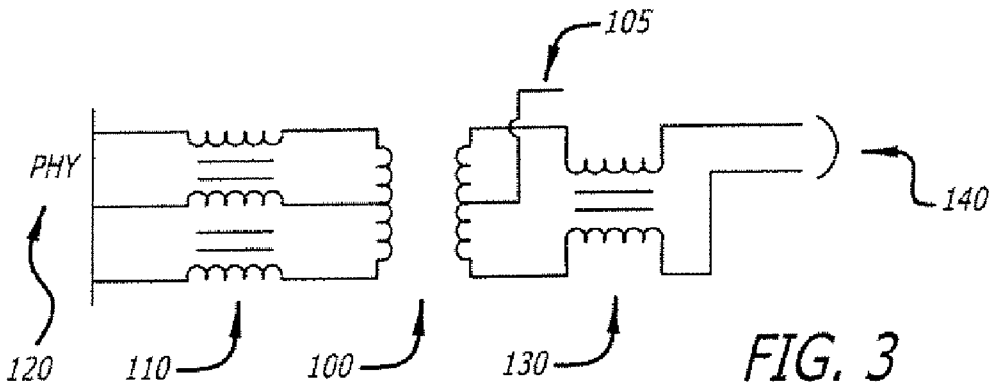
FIG. 3 shows a block diagram of a third coupler.

According to one embodiment of the invention and as shown in FIG. 3, a first common mode choke 110 is provided between PHY 120 and transformer 100, and a second common mode choke 130 is provided between transformer 100 and line 140. In one test, the embodiment of FIG. 3 provided an additional 5 to 10 dB of noise reduction over single-choke topologies such as those shown in FIGS. 1 and 2.

In production, it may be beneficial to integrate transformer 100 and common mode chokes 110 and 130 into the same package, providing a drop-in performance improvement.

In supporting Power over Ethernet (PoE) according to the existing IEEE 802.3af and/or the developing 802.3 at standards, DC power is typically provided using the center tap 105 of transformer 100. Transformer 100 and common mode choke 130 must be designed appropriately to carry PoE current levels through line 140 without saturating.

Figure 4:
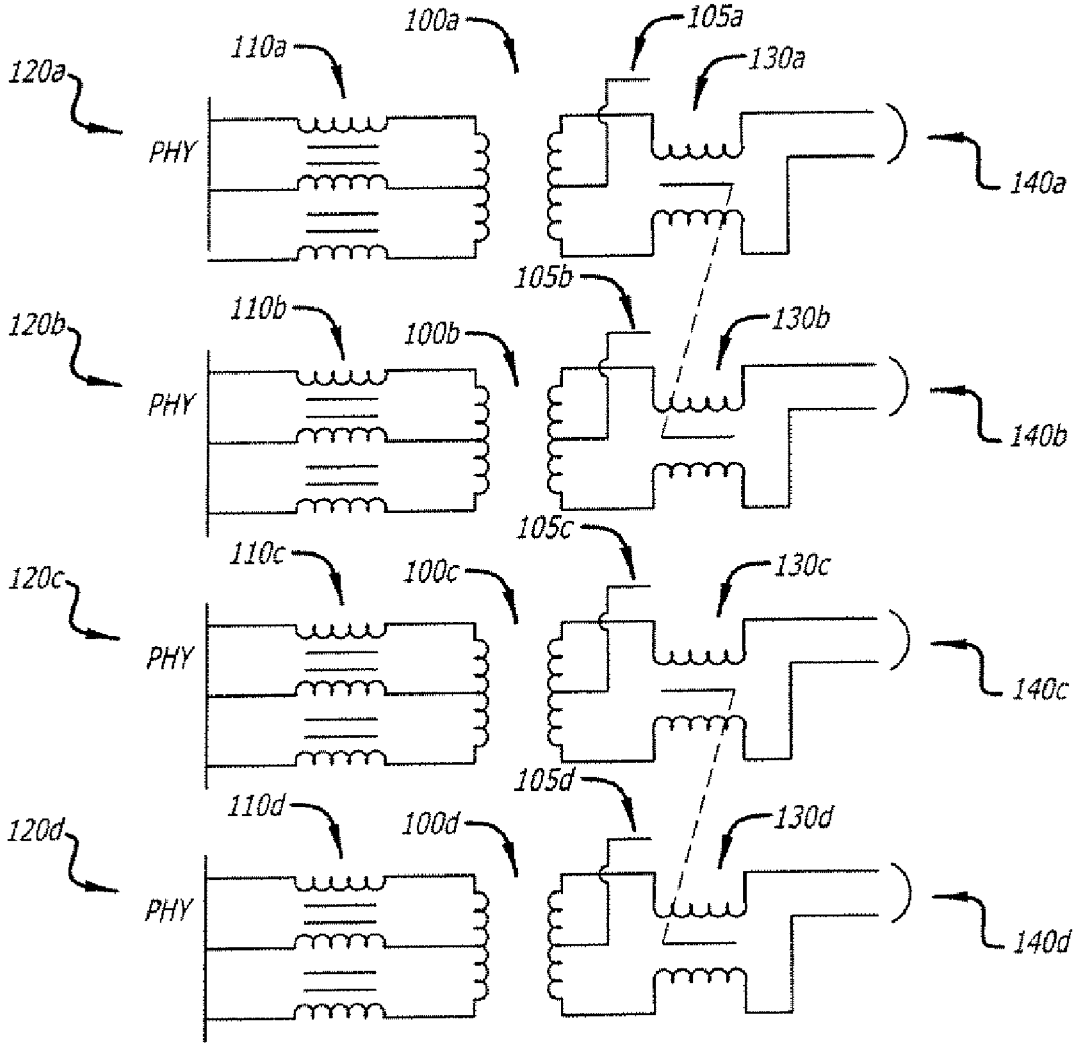
FIG. 4 shows a block diagram of a fourth coupler.

In a second embodiment of the invention as shown in FIG. 4, a choke-transformer-choke combination is provided for each of the four twisted pairs commonly used in 1000BASE-T. In an embodiment designed for 10BASE-T and/or 100BASE-TX, only two sets may be needed. It may be beneficial to package the components together, either packaged together in pairs, or all four in one package. It may be beneficial to package the components together in a connector, such as an RJ-45 style jack commonly used for Ethernet over twisted pair.

In a POE environment, DC power is transferred through the center tap 105 of transformer 100, through transformer 100, and through common mode choke 130 and twisted pair 140. As previously mentioned, these components must be appropriately designed to handle POE currents, on the order of 350 to 400 mA under 802.3af standards. In the embodiment of FIG. 4, as an example, the positive supply connects to center tap 105*a*, and the negative return to center tap 105*b*, By winding common mode chokes 130*a* and 130*b* on the same core, as shown in FIG. 4, and similarly winding common mode choke 130*c* and 130*d* on the same core, the DC POE currents cancel out.

While the invention has been described in terms of several embodiments, the invention should not be limited to only those embodiments described, but can be practiced with modification and alteration within the spirit and scope of the appended claims. The description is this to be regarded as illustrative rather than limiting.

What is claimed is:

1. A coupler assembly for connecting an Ethernet PHY to a twisted pair line comprising:

a first common mode choke for connecting to the Ethernet PHY, an output of the first common mode choke connecting to a primary of a transformer, a secondary of the transformer connecting to an input of a second common mode choke, an output of the second common mode choke for connecting to the twisted pair line.

2. The coupler assembly of claim 1 where the first common mode choke, the transformer, and the second common mode choke are integrated into a single package.

3. The coupler assembly of claim 1 where the first common mode choke, the transformer, and the second common mode choke are integrated into a connector.

4. The coupler assembly according to claim 1 comprises a plurality of transformers including the transformer, a plurality of first common mode chokes including the first common mode choke, and a plurality of second common mode chokes including the second common mode choke, wherein a primary of each of the plurality of transformers is coupled to one of the plurality of first common mode chokes and wherein a secondary of each of the transformers is coupled to one of the plurality of second common mode chokes and the plurality of transformers are integrated into a single package.

5. The coupler assembly according to claim 4 where the plurality of transformers are integrated into a connector.

6. The coupler assembly according to claim 4 where two of the plurality of second common mode chokes are disposed on the same core.

7. The coupler assembly according to claim 1 comprises a plurality of transformer including a first, second, third, and fourth transformer, a plurality of first common mode chokes including a first, second, third, and fourth of the plurality first common mode chokes, and a plurality of second common mode chokes including a first, second, third, and fourth of the plurality of second common mode chokes, the first, second, third, and fourth of the plurality of first common mode chokes respectively connected to the first, second, third, and fourth of the plurality of transformers, the first, second, third, and fourth of the plurality of transformers respectively connected to the first, second, third, and fourth of the plurality of second common mode chokes, the first and the second of the plurality of second common mode chokes disposed on a common core, and the third and the fourth of the plurality of second common mode chokes disposed on a common core.

8. The coupler assembly according to claim 7 integrated into a single package.

9. The coupler assembly according to claim 7 integrated into a connector.

10. A coupler assembly comprising:

a first transformer having a primary winding and a secondary winding;

a first of a first common mode choke connecting a first Ethernet physical layer (PHY) to the primary winding of the first transformer; and a first of a second common mode choke connecting the secondary winding of the first transformer to a first twisted pair line.

11. The coupler assembly of claim 10 wherein the first of the first common mode choke, the first transformer, and the first of the second common mode choke are integrated into a single package.

12. The coupler assembly of claim 10 wherein the first of the first common mode choke, the first transformer, and the first of the second common mode choke are integrated into a connector.

13. The coupler assembly of claim 10 further comprising:

a second transformer, a third transformer, and a fourth transformer, each of the second, third, and fourth transformers having a primary winding and a secondary winding;

a second of the first common mode choke, a third of the first common mode choke, and a fourth of the first common mode choke, wherein each of the second, third, and fourth of the first common mode chokes respectively connects a second, third, and fourth Ethernet PHY to the primary winding of the second, third, and fourth transformers, respectively; and a second of the second common mode choke, a third of the second common mode choke, and a fourth of the second common mode choke, wherein each of the second, third, and fourth of the second common mode chokes respectively connects the secondary winding of the second, third, and fourth transformers to a second, third, and fourth twisted pair line, respectively.

14. The coupler assembly according to claim 13 integrated into a single package.

15. The coupler assembly according to claim 13 integrated into a connector.

16. The coupler assembly according to claim 13 wherein the first and the second of the second common mode chokes are disposed on a first common core, and the third and the fourth of the second common mode chokes are disposed on a second common core.

17. The coupler assembly according to claim 16 integrated into a single package.

18. The coupler assembly according to claim 16 integrated into a connector.

* * * * *